(12) United States Patent  (10) Patent No.: US 7,280,414 B2
Kato  (45) Date of Patent: Oct. 9, 2007

(54) NON-VOLATILE MEMORY DEVICE, AND CONTROL METHOD THEREFOR

(75) Inventor: Kenta Kato, Seto (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/215,850

(22) Filed: Aug. 30, 2005

(65) Prior Publication Data

US 2006/0044877 A1  Mar. 2, 2006

Related U.S. Application Data

(63) Continuation of application No. PCT/JP2004/012522, filed on Aug. 31, 2004.

(51) Int. Cl.
  *G11C 5/14* (2006.01)
(52) U.S. Cl. ............... 365/189.09; 365/189.11
(58) Field of Classification Search ........... 365/189.09, 365/189.11
  See application file for complete search history.

(56) References Cited

U.S. PATENT DOCUMENTS

| 6,249,458 | B1 * | 6/2001 | Shokouhi et al. ...... 365/185.23 |
| 6,483,366 | B2 * | 11/2002 | Ho ............................. 327/333 |
| 6,906,967 | B2 * | 6/2005 | Choi et al. ............. 365/189.09 |
| 7,023,262 | B2 * | 4/2006 | Sim et al. .................... 327/541 |

FOREIGN PATENT DOCUMENTS

| JP | 57-030419 | 2/1982 |
| JP | 06-089574 | 3/1994 |
| JP | 06-168597 | 6/1994 |
| JP | 07-037396 | 7/1995 |
| JP | 2002-074951 | 3/2002 |
| JP | 2003-199329 | 7/2003 |
| JP | 2003-272396 | 9/2003 |
| JP | 2004-103143 | 4/2004 |

* cited by examiner

*Primary Examiner*—Kretelia Graham
(74) *Attorney, Agent, or Firm*—Ingrassia Fisher & Lorenz, PC

(57) ABSTRACT

During an erase operation, lower decoder groups 20(*i*) and 21(*i*) (i=1 to m) of erase-target sectors are connected, at their respective low voltage power supply terminals (VL), to a first negative voltage supply line (VM) via switches (B) (50 and 51, respectively) and a negative bias voltage is supplied to local word lines. The first negative voltage supply line (VM) is connected to a level shift circuit (4), and is level-shifted to a voltage at a higher level relative to that of a second negative voltage (VMP) which is output from a negative voltage generator circuit (3) via a second negative voltage supply line (VMP). An upper decoder group (10) is connected, at its low voltage power supply terminal (VL), to the second negative voltage line (VMP) via a switch (A) (5). All global word lines GWL0(*i*) (i=0 to m) are biased to the second negative voltage (VMP) by an active signal (ACTB0 (*i*)) at high level supplied to the upper decoder group (10) and are biased to a lower voltage level relative to the first negative voltage (VM) as a bias voltage to the local word lines.

2 Claims, 8 Drawing Sheets

| MODE | SECTOR | GWL | GWLB | VPX | NEGP | ERB | ACTB | VWL | XDS | WL | WELL |
|---|---|---|---|---|---|---|---|---|---|---|---|
| ERASE | SECTOR(S00) | -10 | 0 | 0 | -10 | 0 | 0 | 0 | -9 | -9 | 9 |
|  | SECTOR(S10) | 0 | 0 | 1.8 | 0 | 0 | 1.8 | 0 | 0 | FLOATING | 9 |
|  | SECTOR(S01) | -10 | 0 | 0 | -10 | 0 | 0 | 0 | 0 | 0 | 0 |
| PROGRAM | SECTOR(S00) | 9/0 | 0/1.8 | 9 | 0 | 1.8 | 0/1.8 | 9/0 | 0 | 9/0 | 0 |
|  | SECTOR(S10) | 0 | 1.8 | 1.8 | 0 | 1.8 | 1.8 | 9/0 | 0 | 0 | 0 |
|  | SECTOR(S01) | 9/0 | 0/1.8 | 9 | 0 | 1.8 | 0/1.8 | 0 | 0 | 0 | 0 |

FIG. 4

NON-VOLATILE MEMORY DEVICE, AND CONTROL METHOD THEREFOR

CROSS-REFERENCES TO RELATED APPLICATIONS

This is a continuation of International Application No. PCT/JP2004/012522, filed Aug. 31, 2004 which was not published in English under PCT Article 21(2).

TECHNICAL FIELD

This invention relates to the application of a bias voltage in a non-volatile memory device and, more particularly, relates to efficient application of an internally-generated negative bias voltage.

BACKGROUND

1. Background Art

With reference to Japanese unexamined patent application publication No. 1995-37396 (Patent Document I), a word line Xi is activated by a drive device 280, and a predecoder (not shown) outputs a decoded predecode signal VA to the drive device 280 (FIG. 10). The drive device 280 is provided with two P-channel transistors 780, 800 connected between a multiplexed signal MUXi and ground. A gate of the P-channel transistor 780 is connected to VA. A gate of the P-channel transistor 800 is connected to a fixed voltage VN. A node 810 is connected to the word line Xi associated with the drive device 280 and to a negative charge pump circuit 320. When a negative bias is applied to the word line Xi, the level of VA is rendered high, thereby preventing the negative bias from leaking through the P-channel transistor 780.

2. Problems to be Solved by the Invention

The problem is that with the advance in high-capacity storage technologies, the word line Xi becomes an interconnection line having a great length with many memory cells connected thereto. As a result, the wiring capacity of the word line Xi becomes significant. In order to apply a high voltage to the word line Xi at high speeds, the P-channel transistor 780 is required to have the ability to adequately supply electric current to the word line Xi. This inevitably results in the increase in transistor size, which is counter to the need for large-scale integration of the non-volatile memory device that is needed with the advance in high-capacity storage technologies. In addition to this problem, another problem is that the increase in parasitic capacitance associated with the increase in transistor size interferes with the high-speed responsivity.

The large-sized P-channel transistor 780 also has a large gate capacitance, and the driver capacity of the predecoder (not shown) has to be increased to drive the gate of the P-channel transistor 780, which is also counter to the demand for large-scale integration of the non-volatile memory device needed for high-capacity storage technologies and which may also interfere with the high-speed responsivity.

In order to avoid the above-described problems, N-channel transistors each having a higher current drive capacity may be provided in place of the P-channel transistors 780 and 800. FIG. 11 shows a configuration of such arrangement. With reference to FIG. 11, there is also shown the bias relationship during the erase operation in which a negative bias is applied to a word line WL. N-channel transistors T1 and T2 are provided in place of the P-channel transistors 780 and 800 (Patent Document I).

Application of a negative bias (for example, −9 V) to the word line WL is made by supplying, after the level of a gate signal GWLB is rendered low (such as 0 V), a negative bias (for example, −9 V) to a source terminal XDS. At this time, a gate signal GWL of the N-channel transistor T1 is fed a negative bias of the same potential as the word line WL. In this case, a drain signal VWL is at a low level (such as 0 V). The N-channel transistor T1 is therefore biased to the electrically non-conductive state, and the gate-to-source voltage (VGS) thereof is 0 V.

With the advance in high-capacity storage technologies or for realization of high-speed access operations, it is necessary that the capacity to supply voltage to the word line WL be secured adequately while, on the other hand, there are restraints on transistor size because of the demand for improvement in the degree of integration. To cope with this inconsistency, the N-channel transistor T1 is employed, thereby securing adequate drive capabilities by miniaturization and by lowering of the threshold voltage. Consequently, there is the possibility that a leak current may flow even in a state of: VGS=0 V. In other words, a so-called tailing current may flow. The erase operation is carried out either for each sector which is a predetermined block within a memory cell array or for each sector group, and as high-capacity storage technologies advance, the number of in-sector word lines probably increases. Even if the tailing current flowing through an individual N-channel transistor T1 is a minute electric current, the negative bias of the word line WL may increase when the tailing current flows through many N-channel transistors T1. Since the capacity to supply negative bias generated from a positive voltage supply (such as a power supply voltage) depends on the performance of a charge pump circuit, there is the possibility that no predetermined negative voltage can be held for some types of inflow currents. In a memory cell of the non-volatile memory device in which an erase operation is carried out on the condition that a predetermined negative bias is applied, there is the possibility that with the rise in voltage value of the negative bias, the erase operation is left unfinished. Another possible problem is that normal data storage might not be assured. In addition, still another problem is that assurance of the capacity to absorb tailing current inevitably requires employment of a large scale configured charge pump circuit.

The provision of a FCER (Fast Chip Erase) mode or accelerator mode (ACC mode) as a function of simultaneously batch-erasing many sectors further increases the number of word lines WL that are supplied with negative bias voltages, thereby causing the tailing current to flow through a greater number of N-channel transistors T1. This results in the problem where it becomes more difficult to hold negative bias at a predetermined voltage level.

SUMMARY OF THE INVENTION

Means for Solving the Problem

The present invention was made to provide solutions to at least one of the problems with the prior art techniques described above. Accordingly, an object of the present invention is to provide a non-volatile memory device capable of assuring the efficient supply of bias voltage by the reduction of leak current and/or by enhancing the capacity to supply bias voltage as required, at the time of application of the negative bias voltage generated within the non-volatile memory device, and to provide a control method for such non-volatile memory device.

In order to accomplish the aforesaid object, a first aspect of the present invention provides a non-volatile memory device which is characterized in that it comprises a first N-type transistor arranged between a first terminal and a word line, the first N-type transistor supplying the word line with a positive voltage supplied to the first terminal, and a negative voltage generator section for generating a first negative voltage and for supplying a control terminal of the first N-type transistor with a second negative voltage where the voltage level of the second negative voltage is lower than the voltage level of the first negative voltage.

The first aspect of the present invention also provides a control method for a non-volatile memory device which includes first N-type transistors which are arranged between first terminals and word lines and become electrically conductive when positive voltage is supplied to the word lines from the first terminals. The non-volatile memory device control method of this first aspect is characterized in that it comprises the steps of supplying a first negative voltage to the word lines and supplying control terminals of the first N-type transistors a second negative voltage, where the voltage level of the second negative voltage is lower than the voltage level of the first negative voltage when the first negative voltage is supplied to the word lines.

In the first aspect of the non-volatile memory device and its control method in accordance with the first invention, there is provided a first N-type transistor which is disposed between a first terminal and a word line and which is rendered electrically conductive when a positive voltage is placed on the word line from the first terminal, and, at the time of application of a first negative voltage to the word line, a control terminal of the first N-type transistor is provided a second negative voltage which is at a lower voltage level than that of the first negative voltage.

A second aspect of the present invention provides a non-volatile memory device which is characterized in that it comprises a negative voltage generator section for supplying negative voltage to word lines, and a power switch section for switching power to be supplied to the negative voltage generator section from a lower to a higher voltage power supply depending on a predetermined increase in a load condition on the negative voltage generator section.

A third aspect of the present invention provides a non-volatile memory device which is characterized in that it comprises a charge pump circuit, a negative voltage generator section for supplying negative voltage to word lines, and a frequency switch section for switching from a first operation frequency for charge pump operation to a second operation frequency higher than the first operation frequency depending on a predetermined load condition on the negative voltage generator.

A fourth aspect of the present invention provides a non-volatile memory device which is characterized in that it comprises a negative voltage generator section for supplying negative voltage to word lines, and an auxiliary negative voltage generator section for starting operation of the negative voltage generator section in response to a predetermined load condition on the negative voltage generator section.

The second aspect of the present invention also provides a control method for a non-volatile memory device. The non-volatile memory device control method of the second aspect of the present invention is characterized in that it comprises the steps of selecting word lines, supplying negative voltage to the word lines selected, and continuing supply of the negative voltage if the number of the word lines selected is the same as or larger than a predetermined number.

In accordance with the second aspect of the non-volatile memory device during supply of the negative voltage to the word lines by means of the negative voltage generator section, the power switch section switches the level of power supply to the negative voltage generator section to a higher value relative to a normal power supply level in response to a predetermined load condition which causes the load on the negative voltage generator section to increase.

In accordance with the third aspect of the non-volatile memory device, during supply of the negative voltage to the word lines by means of the negative voltage generator section, the frequency switch section switches the level of an operation frequency of the charge pump circuit disposed in the negative voltage generator section to a higher value relative to a normal frequency level in response to a predetermined load condition which causes the load on the negative voltage generator section to increase.

In accordance with the fourth aspect of the non-volatile memory device, during supply of the negative voltage to the word lines by means of the negative voltage generator section, the auxiliary negative voltage generator section is activated as a substitute for the negative voltage generator section or is activated in addition to the negative voltage generator section in response to a predetermined load condition which causes the load on the negative voltage generator section to increase.

In accordance with the second aspect of the non-volatile memory device control method, the capacity to supply negative voltage is increased in response to a condition that, when word lines are selected and negative voltage is supplied to the word lines selected, the number of the world lines selected is equal to or larger than a predetermined amount.

In accordance with the first aspect of the non-volatile memory device and its control method, the control terminal of the first N-type transistor is supplied with the second negative voltage at a lower level relative to the first negative voltage supplied to the word lines. In the first N-type transistor, which becomes electrically conductive when its control terminal is supplied with a voltage at a higher level relative to the other terminals, the voltage at the control terminal becomes constant and a reverse bias is applied to a terminal that is in connection with the word lines, so that the first N-type transistor is turned off without fail. Thereby, even in the case where the first N-type transistor has a low threshold voltage and a leak current such as a tailing current or other like current flows when there is no difference in voltage level between the control terminal and the other terminals, it is ensured that the first N-type transistor is turned off without fail, thereby making it possible to reduce leak current. Thus, supply of the first negative voltage to the word lines is assured.

In addition, in accordance with the non-volatile memory devices of the second to fourth aspects, the capacity to supply negative voltage can be increased: by supplying the negative voltage generator section with power at a higher voltage level by making the operation frequency of the charge pump circuit disposed in the negative voltage generator section higher, or by making the auxiliary negative voltage generator section active, in response to a predetermined load condition which causes an increase in the load on the negative voltage generator section. If any state in which the amount of leak current, such as a tailing current or the like, increases is set as the predetermined load condition, such a setting makes it possible to increase the capacity to supply negative voltage in response to the increase in leak current, and it is ensured that negative voltage is supplied to the word lines without fail, regardless of the increase in leak current.

In accordance with the second aspect of the non-volatile memory device control method, it is possible to increase the capacity to supply negative voltage when the number of word lines selected as negative voltage supply targets is equal to or larger than a predetermined amount. If leak current is present in each word line, this causes the number of selected word lines to increase and therefore causes the total leak current amount to increase. Even in such cases, the capacity to supply negative voltage can be increased, and is the present invention ensures that negative voltage is supplied to the word lines, regardless of the increase in leak current.

In accordance with the present invention, the first negative voltage or any other negative voltage is supplied to the word lines without fail, thereby ensuring that circuit operations, such as an erase operation, in which negative voltage is supplied to the word lines are carried out without fail.

Because of the reduction of leak current when negative voltage is supplied to word lines, the negative voltage supplying capacity of the negative voltage generator section can advantageously be lowered to a minimum, and miniaturization of circuit dimensions can be achieved. In addition, since it is possible to increase the capacity to supply negative voltage as required, there is no need to have any unnecessary voltage supplying capacities in the circuit. The reduction of circuit's consumption current can be accomplished and miniaturization of the circuit dimensions can be realized.

BRIEF DESCRIPTION OF DRAWINGS

FIG. 4 is a diagram representing a voltage bias condition in a non-volatile memory device in accordance with the present invention;

DETAILED DESCRIPTION OF THE INVENTION

Hereinafter, with reference to FIGS. 1-9, specific embodiments of non-volatile memory devices and control methods thereof in accordance with the present invention will be described in detail.

Figure 1:
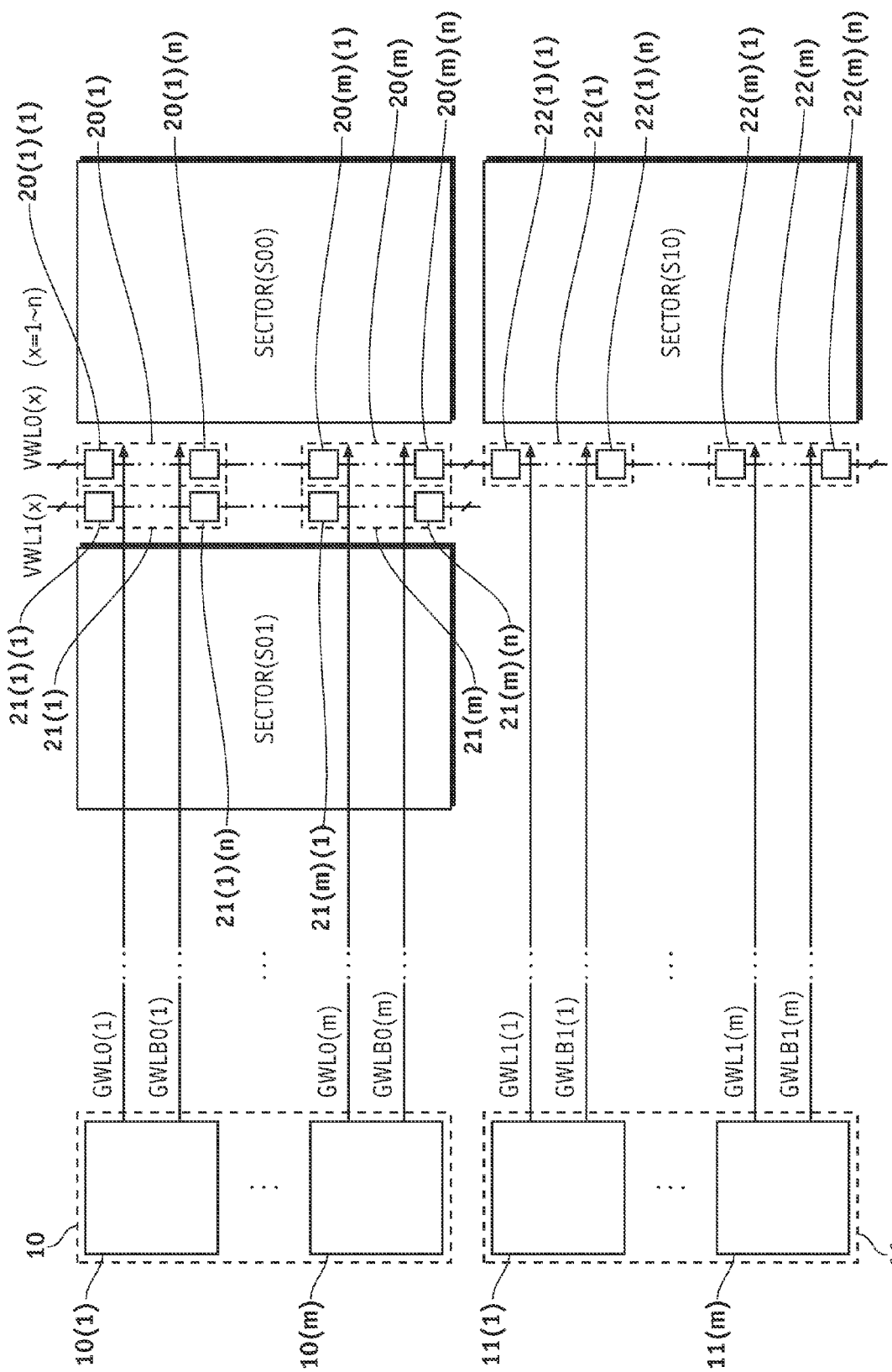
FIG. 1 is a diagram showing an arrangement layout of sectors and row-wise decoders in a non-volatile memory device in accordance with the present invention.

With reference to FIG. 1, there is illustrated an arrangement layout of (i) sectors S00-S10, i.e., memory cell regions, which are arranged in access control units and in which a plurality of memory cells are connected to word lines in a predetermined number of memory cells per word line and (ii) a decoder group for decoding row-wise addresses per sector in a memory cell array of a non-volatile memory device in accordance with the present invention.

The decoder group is composed of: upper decoder groups 10 and 11 provided per sector row in the same row direction; m sets of lower decoder groups 20(1) through 20(m) for the sector S00; m sets of lower decoder groups 21(1) through 21(m) for the sector S00; and m sets of lower decoder groups 22(1) through 22(m) for the sector S10.

The upper decoder group 10 includes upper decoders 10(1) through 10(m). The upper decoder group 11 includes upper decoders 11(1) through 11(m). The upper decoders 10(1) through 10(m) select m sets of global word lines GWL0(1)/GWLB0(1) through GWL0(m)/GWLB0(m) and the upper decoders 11(1) through 11(m) select m sets of global word lines GWL1(1)/GWLB1(1) through GWL1(m)/GWLB1(m), where two different word lines (i.e., a global word line GWL and a global word line GWLB) together form a single word line set on which signals are output as complementary decode signals in operations other than the erase operation. In other words, they are output in the program and read operations.

The lower decoder groups 20(1) through 20(m), 21(1) through 21(m), and 22(1) through 22(m) receive the global word lines of the upper decoder groups 10 and 11 laid out in the same row direction and perform further decoding on them. Stated another way, connected to the lower decoder groups 20(1) through 20(m) and 21(1) through 21(m) are the global word lines GWL0(1)/GWLB0(1) through GWL0(m)/GWLB0(m), and connected to the lower decoder groups 22(1) to 22(m) are the global word lines GWL1(1)/GWLB 1(1) through GWL1(m)/GWLB 1(m).

The lower decoder groups 20(1, . . . , m) are provided with n lower decoders 20(1)(1, . . . , n), . . . , 20(m)(1, . . . , n), respectively. The lower decoder groups 21(1, . . . , m) are provided with n lower decoders 21(1)(1, n), . . . , 21(m)(1, . . . , n), respectively. And, the lower decoder groups 22(1, . . . , m) are provided with n lower decoders 22(1)(1, . . . , n), . . . , 22(m)(1, . . . , n), respectively. Each lower decoder is selected, per sector row arrayed in the same column direction, by n predecode lines VWL0(1) through VWL0(n) and n predecode lines VWL1(1) through VWL1(n). These predecode lines VWL0(1) through VWL0(n) and VWL1(L) through VWL1(n) are first terminals. Local word lines (not shown) for driving control gate terminals of memory cells within the sector are connected to the lower decoders, and predetermined local word lines are selected by combinations of the global word lines GWL0(1)/GWLB0(1) through GWL0(m)/GWLB0(m), GWL1(1)/GWLB1(1) through GWL1(m)/GWLB1(m) and the predecode lines VWL0(x) and VWL1(x) (x=1 to n), so that bias voltage is supplied thereto.

Figure 2:
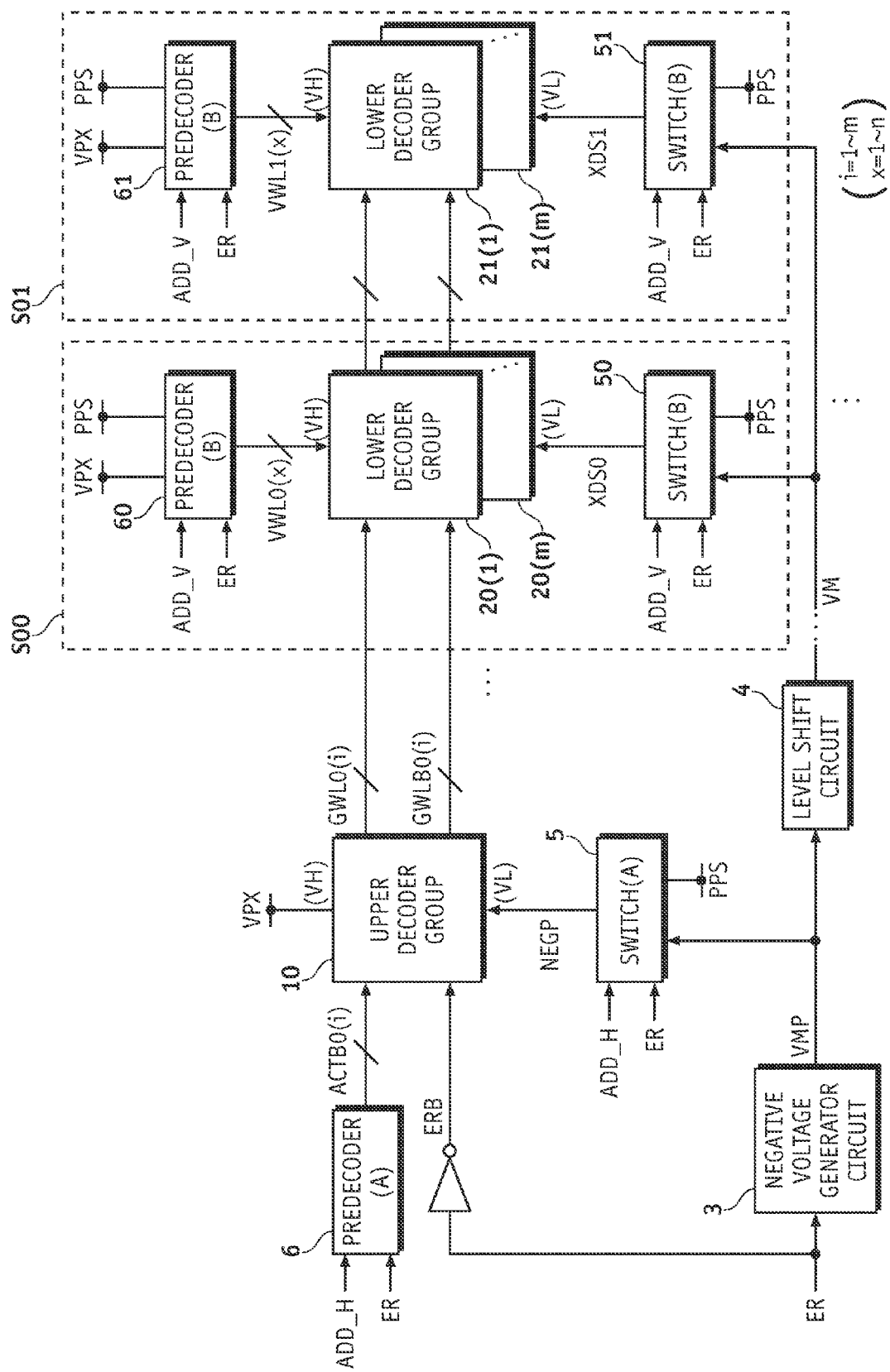
FIG. 2 is a circuit block diagram showing row-wise decoder groups and their control circuits in accordance with a first embodiment of the present invention.

With reference to FIG. 2, a first embodiment of the present invention is described by taking, as an example, the decoder groups for the sectors S00 and S01 (FIG. 1). The sectors S00 and S01 are provided, respectively, with lower decoder groups 20(*i*) and 21(*i*) (i=1 to m). The lower decoder group 20(*i*) is provided with a high voltage power supply terminal VH and a low voltage power supply terminal VL, wherein the terminal VH is connected, via the predecode line VWL0 (*x*) (x=1 to n), to a predecoder (B) 60 while the terminal VL is connected, via a low side voltage supply line XDS0 as a second terminal, to a switch (B) 50. Likewise, the lower decoder group 21(*i*) is provided with a high voltage power supply terminal VH and a low voltage power supply terminal VL, wherein the terminal VH is connected, via the predecode line VWL1(*x*) (x=1 to n), to a predecoder (B) 61 while the terminal VL is connected, via a low side voltage supply line XDS1 as a second terminal, to a switch (B) 51. In addition, connected respectively to the corresponding lower decoder groups 20(*i*) and 21(*i*) (i=1 to m) are the global word lines GWL0(*i*)/GWLB0(*i*).

The predecoders (B) 60 and 61 are each supplied with a column-wise address ADD_V and an erase signal ER. The predecoder (B) 60 selects either a positive voltage supply line VPX or a ground voltage supply line PPS, thereby establishing connection between VPX or PPS, whichever is selected, and the predecode line VWL0(*x*). In a like manner, the predecoder (B) 61 selects either the positive voltage supply line VPX or the ground voltage supply line PPS, thereby establishing connection between VPX or PPS, whichever is selected, and the predecode line VWL1(*x*) (x=1 to n). In addition, the switches (B) 50 and 51 are also each supplied with a column-wise address ADD_V and an erase signal ER. The switch (B) 50 selects either a first negative voltage supply line VM or the ground voltage supply line PPS, thereby establishing connection between VM or PPS, whichever is selected, and a low side voltage supply line XDS0, and the switch (B) 51 selects either the first negative voltage supply line VM or the ground voltage supply line PPS to establish connection between VM or PPS, whichever is selected, and a low side voltage supply line XDS1. The first negative voltage supply line VM is connected to a level shift circuit 4 so that a second negative voltage VMP, output from a negative voltage generator circuit 3 through the second negative voltage supply line VMP, is level-shifted and supplied thereon.

The global word lines GWL0(*i*)/GWLB0(*i*) (i=1 to m) are selected by the upper decoder group 10. A high voltage power supply terminal VH of the upper decoder group 10 is connected to a positive voltage supply line VPX while a low voltage power supply terminal VL of the upper decoder group 10 is connected via the third terminal, namely a low side voltage supply line NEGP, to a switch (A) 5. The switch (A) 5 is fed the erase signal ER and selects either the second negative voltage supply line VMP or the ground voltage supply line PPS to establish connection between VMP or PPS, whichever is selected, and the low side voltage supply line NEGP.

The upper decoder group 10 is also supplied with an active signal ACTB0(*i*) (i=1 to m) respectively output for each of the upper decoders 10 (*i*) (i=1 to m) that together constitute the upper decoder group 10, and an inverted erase signal ERB which is an inversion of the erase signal ER. The predecoder (A) 6 is fed a row-wise address ADD_H and the erase signal ER.

When the erase signal ER is at low level (the non-erase state), any one of the active signals ACTB0 (*i*) that is selected in response to the row-wise address ADD_H becomes low, and in response to the inverted erase signal ERB at high level, corresponding global word lines GWL0 (*i*) and GWLB0(*i*) become high and low, respectively.

When, at this time, the erase signal ER is at low level with respect to the predecoders (B) 60 and 61 and to the switches (B) 50 and 51, the predecoder (B) 60 and the switch (B) 50 in the sector S00 and the predecoder (B) 61 and the switch (B) 51 in the sector S01 are all in the non-selected state, regardless of the column-wise address ADD_V. Each low side voltage supply line is therefore connected, through the switch (B) in the non-selected state, to the ground voltage supply line PPS, as a result of which a respective corresponding lower decode group is supplied with ground potential. In addition, any one of the predecode lines is connected, through the selected predecoder (B), to the positive voltage supply line VPX, as a result of which its corresponding lower decoder group is fed a positive bias voltage.

The global word lines GWL0(*i*)/GWLB0(*i*), selected by the row-wise address ADD_H and becoming, respectively, high and low, are input to lower decode groups which are selected by the column-wise address ADD_V and the erase signal ER and which are supplied with a positive bias voltage and ground potential, thereby supplying the positive bias voltage to the local word lines (not shown) and selecting associated row-wise memory cells. In this way, the process of row-wise selection during the program or data read operation is executed. At the time when the selection is completed, the active signal ACTB0(*i*) is inverted and becomes high. As a result, the global word line GWL0(*i*) and the global word line GWLB0(*i*) are inverted and become low and high, respectively, and the voltage bias of the local word line which is charged positive is discharged, through the low side voltage supply line, to ground potential which is connected to the ground voltage supply line PPS.

If, in this case, the row-wise address ADD_H is the same and, in addition, the column-wise address ADD_V is not selected, then the predecode lines VWL(x) are connected, through the predecoders (B) 60 and 61, to the ground voltage supply lines PPS. As a result, the local word lines are held at ground potential. In addition, if the row-wise address ADD_H differs, then the global word lines are placed in the non-selected state and the low side voltage supply lines are connected, through the switches (B) 50 and 51, to the ground voltage supply lines PPS. Consequently, the local word lines are held at ground potential.

When the erase signal ER is at high level (the erase state), the negative voltage generator circuit 3 is activated and supplies a second negative voltage VMP to the second negative voltage supply line VMP. The second negative voltage VMP is shifted-in-level to the first negative voltage VM through the level shift circuit 4. In the switch (A) 5, the second negative voltage VMP is selected by the activated erase signal ER and the same row-wise address ADD_H as an erase-target sector and is supplied to the upper decoder group 10. At the same time, the first negative voltage VM is selected either by the activated erase signal ER in the switches (B) 50 and 51 disposed in all the sectors S00 and S01 in the same row direction or by the switches (B) 50 and 51 disposed in the erase-target sectors S00 and S01 which are selected in response to the column-wise address ADD_V, and is supplied to the lower decoder groups 20(*i*) and 21(*i*) (i=1 to m). Then, in the level shift circuit 4, the first negative voltage VM is level-shifted so as to have a higher voltage level relative to that of the second negative voltage VMP.

In addition, the predecoder (A) 6 makes all of the active signals ACTB0(*i*) (i=0 to m) low with respect to the activated erase signal ER. Consequently, all of the global word lines GWL0(*i*) (i=0 to m) supplied from the upper decoder group 10 are connected to the low side voltage supply line NEGP. As a result of this, the global word line GWL0(*i*) (i=0 to m) is biased to the second negative voltage VMP while the global word line GWLB0 (*i*) (i=0 to m) is held at ground potential.

Furthermore, the predecoders (B) 60 and 61 bring the predecode lines VWL0(x) and VWL1(*x*) (x=1 to n) into connection with the ground potential supply lines PPS, with respect to all the sectors S00 and S01 present in the same row direction or with respect to the erase-target sectors S00 and S01 selected in response to the column-wise address ADD_V.

Control of the predecoders (B) 60 and 61 and control of the switches (B) 50 and 51 are provided in the same way as described above. In other words, with respect to the sectors in which the first negative voltage supply line VM is selected in the switches (B) 50 and 51, the ground voltage supply line PPS is selected in the predecoders (B) 60 and 61. The sectors in this connection state are subjected to batch erasing. The first negative voltage VM is commonly supplied to low voltage power supply terminals VL of a low decoder group disposed in an erase-target sector or low decoder groups disposed in multiple erase-target sectors and, in addition, the second negative voltage VMP whose voltage level is lower than that of the first negative voltage VM is commonly supplied to the global word lines GWL0(*i*) (i=0 to m) connected to these lower decoder groups.

Figure 3:
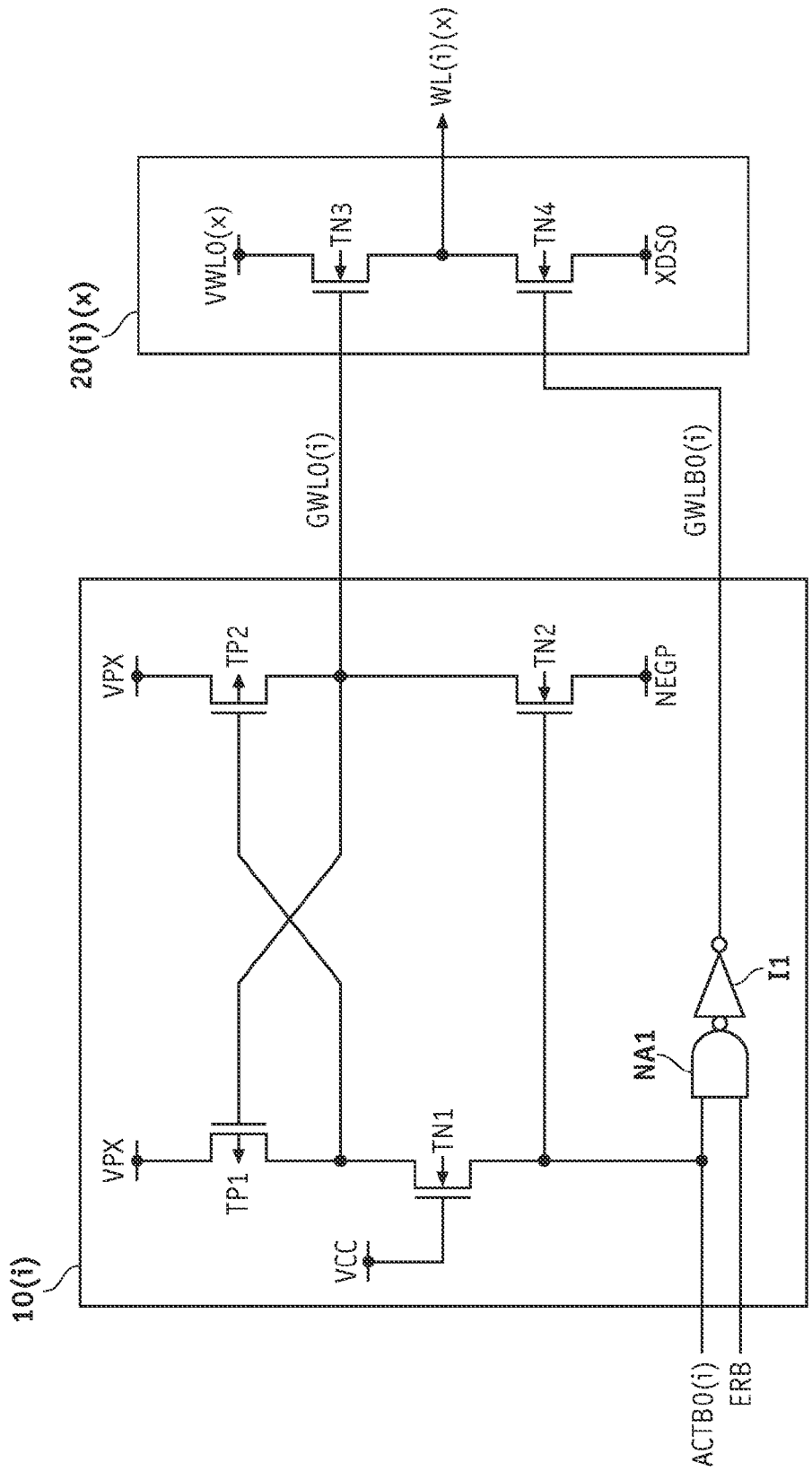
FIG. 3 is a circuit diagram showing upper and lower decoders in accordance with the present invention.

FIG. 3 illustrates the decoder groups of FIG. 2, showing an example circuit configuration of an upper decoder 10(*i*) (i=1 to m) in the upper decoder group 10 and an example circuit configuration of a lower decoder 20(*i*)(*x*) (x=1 to n) in the lower decoder group 20(*i*). The upper decoder group 10 is provided with m sets of upper decoders 10(*i*) (i=1 to m), and each of the upper decoders 10(*i*) (i=1 to m) has the same circuit configuration as the one shown in FIG. 3. During the non-erase operation, each of the upper decoders 10(*i*) (i=1 to m) is individually selected and controlled by a respective active signal ACTB0(*i*) (i=1 to m). On the other hand, during the erase operation, all of the upper decoders 10(*i*) (i=1 to m) are selected at the same time because all of the active signals ACTB0 (*i*) (i=1 to m) are simultaneously activated to the low level. Each of the upper decoders 10(*i*) (i=1 to m) is coupled to n sets of lower decoders 20(*i*)(*x*) (i=1 to m; x=1 to n). The global word lines GWL0(*i*)/GWLB0(*i*) (i=1 to m) are commonly connected to the lower decoders 20(*i*)(*x*) (i=1 to m).

The upper decoder 10(*i*) is provided with PMOS transistors TP1 and TP2. A source terminal of each of the PMOS transistors TP1 and TP2 is connected to a respective positive voltage supply line VPX, and a drain terminal of each of the PMOS transistors TP1 and TP2 is connected to a gate terminal of the other PMOS transistor. The drain terminal of the PMOS transistor TP1 is connected, via an NMOS transistor TN1, to an input terminal at which the active signal ACTB0(*i*) is input. The drain terminal of the PMOS transistor TP2 is connected, via an NMOS transistor TN2 as a third N-type transistor, to the low side voltage supply line NEGP. The gate terminal of the NMOS transistor TN1 is connected to a power supply voltage VCC while the gate terminal of the NMOS transistor TN2 is connected to the active signal's ACTB0(*i*) input terminal. The global word line GWL0(*i*) is output from a connection point between the PMOS transistor TP2 and the NMOS transistor TN2. In addition, the active signal ACTB0(*i*) and the erase signal ERB are input to a NAND gate NA1, and the NAND gate NA1 produces an output signal as the global word line GWLB0(*i*) by way of an inverter gate I1. Here, the NMOS transistor TN1 accomplishes a function of limiting a bias voltage applied to the input terminal of the active signal ACTB0(*i*) so as to fall below the power supply voltage VCC. During the program operation or other like operation, even when a step-up voltage in excess of the power supply voltage VCC is applied to the positive voltage supply line VPX, the voltage which is applied to the input terminal of the active signal ACTB0(*i*) is so limited as to fall below the power supply voltage VCC by the NMOS transistor TN1.

The lower decoder 20(*i*)(*x*) is composed of an NMOS transistor TN3 serving as a first N-type transistor and an NMOS transistor TN4 serving as a second N-type transistor, wherein the former has a gate terminal connected to the global word line GWL0(*i*) and establishes connection between the predecode line VWL0(*x*) and the local word line WL(i)(x) while the latter has a gate terminal connected to the global word line GWLB0(*i*) and establishes connection between the low side voltage supply line XDS0 and the local word line WL(i)(x).

Here, the predecode line VWL0(*x*) is supplied with voltage values ranging between the ground potential level and the positive voltage level, depending on the operation states. In the erase operation, either the power supply voltage VCC or ground potential is supplied. In the read operation, the power supply voltage VCC is supplied. In the program operation, a step-up voltage is supplied.

The low side voltage supply lines NEGP and XDS0 are supplied with either a negative voltage or ground potential, depending on the operation states. During the read or program operation, ground potential is supplied while during the erase operation, negative voltage is supplied. More specifically, during the read or program operation, the low side voltage supply line NEGP is fed the second negative voltage VMP while the low side voltage supply line XDS0 is fed the first negative voltage VM, the level of which is higher than that of the second negative voltage VMP.

With reference to FIG. 4, the operation of the circuits shown in FIGS. 2 and 3 will be described. FIG. 4 exemplarily illustrates a program operation that is a non-erase operation. Note that each signal line is represented with its suffix representation omitted.

For the case of the program operation, the inverted erase signal ERB is at high level. The power supply voltage is at a voltage level of, for example, 1.8 V. The low side voltage supply lines NEGP and XDS are held at ground potential by the switches (A) and (B), respectively (FIG. 2). Additionally, in regard to the positive voltage supply line VPX 9 V, for example, is applied as a step-up voltage to the upper decoders that perform decoding on the sector S00 containing therein program-target memory cells, depending on the circuit (not shown). In regard to the upper decoders for non-program target sectors such as the sector S10, for example, 1.8 V is supplied as the power supply voltage VCC.

In the upper decoder that performs decoding on the sector S00 having program-target memory cells, any one of the active signals ACTB is activated to the low level (for example, ground potential) while the other active signals are held at high level (in this example, 1.8 V as the power supply voltage VCC). For the case of the upper decoder that performs decoding on the sector S10 in the absence of a program-target memory cell, every active signal ACTB is held at high level (in this example, 1.8 V).

As shown in FIG. 3, in the upper decoder 10(*i*), in response to the active signal ACTB0(*i*) of low level, the gate terminal of the PMOS transistor TP2 becomes low via the NMOS transistor TN1. The PMOS transistor TP2 becomes electrically conductive while the NMOS transistor TN2 becomes electrically non-conductive. The global word line GWL0(*i*) is activated to the voltage level of the positive voltage supply line VPX (for example, 9 V). At this time, the PMOS transistor TP1 becomes electrically non-conductive and remains in this electrically non-conductive state. Since the inverted erase signal ERB is at high level, the global word line GWLB0(*i*) corresponding to the active signal ACTB0(*i*) of low level becomes low (in this example, ground potential). On the other hand, with regard to the active signal ACTB of high level, the logical level of the global word lines GWL/GWLB becomes inverted.

In the lower decoder, the predecode line VWL selected in response to the column-wise address ADD_V is selected and becomes high. The voltage level at this time is, in this example, 9 V by the voltage step-up circuit (not shown). Since the predecode line VWL is wired column-wise, high level is supplied to the sectors S00 and S10 in the same column-direction. Any other predecode lines VWL of the sectors S00 and S10 that have not been selected by the column-wise address ADD_V and the predecode lines VWL of the sector S01 are held at low level.

The global word lines GWL/GWLB activated to the low and high level are connected to lower decoders of the sectors S00 and S01 that are arranged in the same row direction. As shown in FIG. 3, in the low lower decoders 20(*i*)(*x*), the NMOS transistor TN3 becomes electrically conductive while the NMOS transistor TN4 becomes electrically non-conductive. Consequently, the predecode line VWL0(*x*) is brought into connection with a local word line. On the other hand, the predecode line VWL0(*x*) activated to the high level is connected to the lower decoder 20(*i*)(*x*) in the sectors S00 and S10 in the same column-direction. Consequently, the local word line WL selected in the sector S00 is connected to the predecode line VWL0(*x*) at a high level, and is biased to a positive voltage corresponding to the program operation.

For the case of the erase-operation, the inverted erase signal ERB is at low level. In addition, the column-wise address ADD_V within the sector is not identified and the predecode line VWL is held at low level. By the switch (A) of FIG. 2, the second negative voltage supply line VMP is connected to the low side voltage supply line NEGP arranged in the same row direction as the sector S00 which is an erase target. The negative voltage generator circuit 3 supplies the second negative voltage VMP to the second negative voltage supply line VMP. The second negative voltage VMP is, for example, 10 V. Additionally, the ground voltage supply line PPS is connected to the low side voltage supply line NEGP arranged in a different row direction from the erase-target sector S00.

The first negative voltage supply line VM, which is selected by a switch (B) of the switches (B) provided for each sector (see FIG. 2) in response to the column-wise address ADD_V indicative of an erase-target sector (i.e., S00), is connected to the low side voltage supply line XDS. The first negative voltage VM (for example, −9 V), level-shifted from the second negative voltage VMP by the level shift circuit 4, is supplied to the low decoders in the erase-target sector S00. With regard to the non-erase target sectors S10 and S01, the ground voltage supply line PPS is connected.

In addition, with regard to the positive voltage supply line VPX, ground potential is supplied to upper decoders that perform decoding on the erase-target sector S00. Then the power supply voltage VCC, in this example 1.8 V, is supplied to upper decoders arranged in a row direction in which the non erase-target sectors are arranged.

In the upper decoders that decode the erase-target sector S00, all of the active signals ACTB are activated to the low level. For the upper decoders in the different row direction from the erase-target sector S00, all of the active signals ACTB are held at high level (i.e., the power supply voltage's VCC level, 1.8 V).

With regard to the upper decoder 10(*i*) that performs decoding on the erase-target sector, since, as shown in FIG. 3, the second negative voltage (in this example, −10 V) is supplied to the low side voltage supply line NEGP, it is preferable to prevent application of high differential voltages to the PMOS transistors TP1 and TP2 and the NMOS transistor TN2 by supplying ground potential or low level to the positive voltage supply line VPX and the active signal ACTB0(*i*).

In the upper decoder 10(*i*) that performs decoding on the erase-target sector S00, the active signal ACTB is at low level (for example, ground potential), and since the second negative voltage (in this example, −10 V) is supplied to the low side voltage supply line NEGP, this causes the NMOS transistor TN2 to electrically conduct, thereby connecting the global word line GWL0(*i*) to the second negative voltage (−10 V). The PMOS transistor TP1 becomes electrically conductive and the gate terminal of the PMOS transistor TP2 is made to be at ground potential. The PMOS transistor TP2 is held in the non-conductive state. Since the inverted erase signal ERB is at low level, the global word line GWLB0(*i*) becomes low. In the upper decoder arranged in the different row direction from the erase-target sector S00, the NMOS transistor TN2 becomes electrically conductive in response to the active signal ACTB of high level; the low side voltage supply line NEGP is at ground potential; and the global word line GWL is made to be at ground potential. In addition, the inverted erase signal is at low level, so that the global word line GWLB is held at low level.

With regard to the erase-target sector S00, since the first negative voltage (in this example, −9 V) is supplied to the low side voltage supply line XDS and the voltage level of the global word line GWLB is at ground potential, the NMOS transistor TN4 of the lower decoder 20(*i*)(*x*) becomes electrically conductive and, as a result, the first negative voltage VM (−9 V) is supplied to the local word line WL(i)(x) (FIG. 3). Since, at this time, the second negative voltage VMP (in this example, −10 V) is supplied to the global word line GWL0(*i*), the NMOS transistor TN3 is in a reverse bias state in which the gate terminal is biased to a negative voltage relative to the drain terminal. Even when employing a MOS transistor with a low threshold voltage such as the NMOS transistor TN3, it is possible to reduce leak current, such as a tailing current, to a satisfactory extent because reverse bias is sufficiently applied.

With regard to the sector S01 out of the non erase-target sectors S10 and S01 that is arranged in the same row direction as the erase-target sector S00, the global word line GWL is the second negative voltage (−10 V) and the NMOS transistor TN3 of the lower decoder becomes electrically conductive while, at the same time, the predecode line VWL which is connected to the word line WL is supplied with ground potential. Accordingly, the word line is held at ground potential. In addition, with regard to the sector S10 arranged in the different row direction from the erase-target sector S00, the global word lines GWL/GWLB are each held at ground potential. Both the NMOS transistors TN3 and TN4 become electrically non-conductive and the local word line WL enters the floating state. The local word line WL in the floating state is affected by capacitance coupling, current leakage, or the like due to the well potential boosted to a high voltage level (in this example, 9 V) and is voltage-level regulated. As a result of this, the local word line WL is held at near the well potential and no erase operation is performed on this word line.

Figure 5:
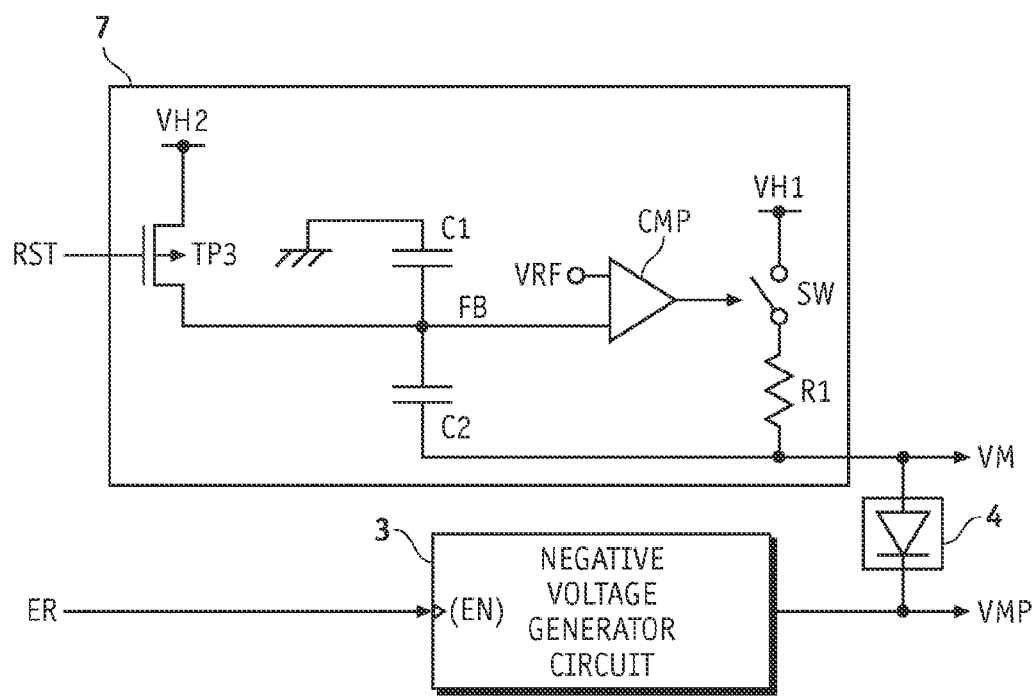
FIG. 5 is a block diagram of a circuit configured to generate a first and a second voltage in accordance with the present invention.

With reference to FIG. 5, there is shown a circuit section for generation of VMP (the second negative voltage) and VM (the first negative voltage). The negative voltage generator circuit 3 which is activated by the erase signal ER outputs a second negative voltage VMP to the second negative voltage supply line VMP. The second negative voltage supply line VMP is connected to the level shift circuit 4. The level shift circuit 4 outputs a first negative voltage VM to the first negative voltage supply line VM. Connected to the first negative voltage supply line VM is a regulator circuit 7.

The negative voltage generator circuit 3 is implemented, for example, by a charge pump circuit or other like circuit. The negative voltage generator circuit 3 extracts charge out of the second negative voltage supply line VMP by charge pump operation, thereby generating a negative voltage and supplying it to the second negative voltage supply line VMP.

The level shift circuit 4 is implemented by a diode element or other like element. The level shift circuit 4 is configured such that its anode and cathode terminals are connected, respectively, to the first negative voltage supply line VM and the second negative voltage supply line VMP. The negative voltage generator circuit 3, formed by a charge pump circuit, extracts charge, in response to which an electric current flows in the forward direction of the diode element. This results in a drop of the forward direction voltage level, and a voltage level shift from the second negative voltage VMP to the first negative voltage VM takes place. Although the forward direction voltage of the diode element depends on the value of a current flowing therethrough, a level shift approximately equivalent to 1 V is made in this case.

The regulator circuit 7 includes: a comparator CMP to which a feedback node FB and a reference voltage VRF are connected, a switch circuit SW which is on/off controlled by an output signal from the comparator CMP and one of which ends is connected to a voltage supply VH1 of a higher voltage level than that of the first negative voltage supply line VM, and a resistor element R1 which is connected between the other end of the switch circuit SW and the first negative voltage supply line VM. Furthermore, a capacitor C1 is connected between the feedback node FB and ground potential, a capacitor C2 is connected between the feedback node FB and the first negative voltage supply line VM, and a PMOS transistor TP3 is connected between the feedback node FB and a voltage supply VH2 at a predetermined voltage-level. A gate terminal of the PMOS-transistor TP3 is supplied, prior to execution of an erase operation, with a reset signal RST of low pulse.

The erase operation starts after the feedback node FB is reset when the low-pulse reset signal RST is output. When the erase signal ER becomes high and the negative voltage generator circuit 3 is activated, a charge pump operation is carried out so that charges present in the first negative voltage supply line VM are extracted therefrom through the second negative voltage supply line VMP and the level shift circuit 4. Consequently, the first and second negative voltage supply lines VM and VMP each undergo a drop of the potential thereon. The potential of the feedback node FB also falls depending on the capacitance coupling of the capacitor C2. The drop in potential of the first and second negative voltage supply lines VM and VMP continues to take place and the potential of the feedback node FB falls below the referential voltage VFB, in response to which the switch circuit SW becomes electrically conductive thereby allowing an electric current to flow into the first negative voltage supply line VM. As a result, the potential of each of the first and second negative voltage supply lines VM and VMP increases. In response to this, the potential of the feedback node FB also increases. Feedback control is provided in order that there may be provided a balance between the potential of the feedback node FB and the referential voltage VFB. The first and second negative voltage supply lines VM and VMP are each regulated to a predetermined negative voltage, for example −9 V as the first negative voltage VM and −10 V as the second negative voltage VMP. Here, −9 V for the first negative voltage VM is a voltage value based on the voltage bias specifications of the local word line in the erase operation while −10 V for the second negative voltage VMP is a voltage value as a result of an additional drop of the forward direction voltage of the diode element constituting the level shift circuit 4.

The negative voltage of the first negative voltage supply line VM is monitored and, when it falls below a predetermined voltage value, electric current is supplied. The electric current thus supplied is extracted, through the diode element constituting the level shift circuit 4, out of the charge pump circuit constituting the negative voltage generator circuit 3. The current supply of the regulator circuit 7 is controlled within the range of the charge pump circuit's current extraction capacity, whereby the first negative voltage VM and the second negative voltage VMP are held at their respective predetermined voltage levels.

Figure 6:
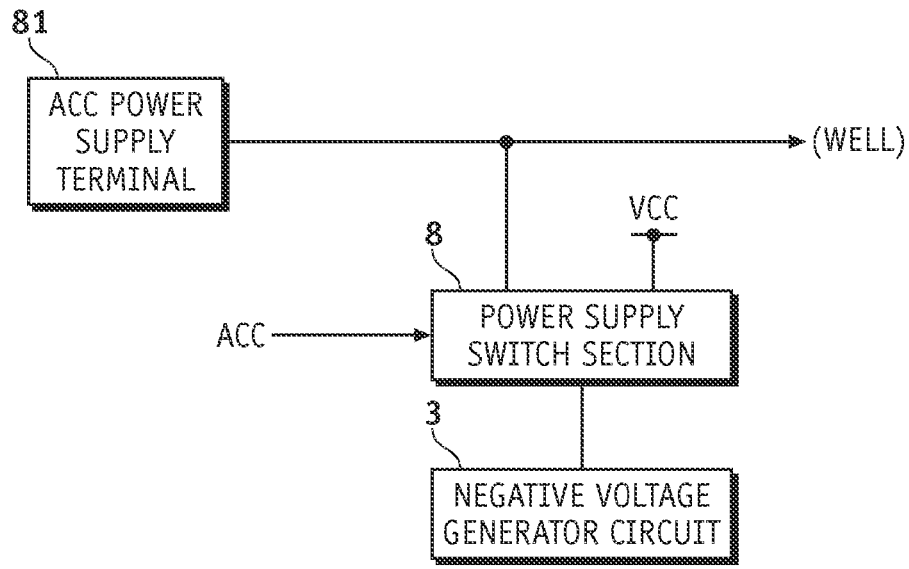
FIG. 6 is a circuit block diagram illustrating a first specific example of a second embodiment of the present invention.
Figure 7:
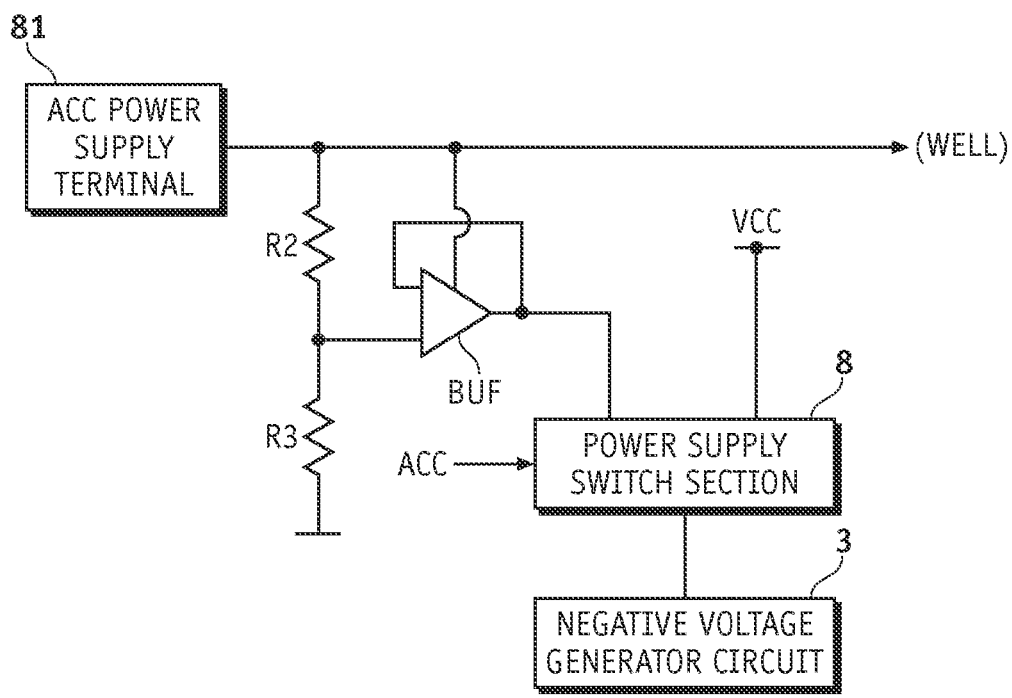
FIG. 7 is a circuit block diagram illustrating a second specific example of the second embodiment of the present invention.

With reference to FIGS. 6 and 7, there are shown circuit block diagrams in accordance with a second embodiment of the present invention. In accordance with the second embodiment, when performing an erase operation by FCER or ACC mode, the power supply to the negative voltage generator circuit 3 is made to be a higher voltage level than that of the power supply voltage VCC employed in the normal operation, thereby increasing the drive capacity of the negative voltage generator circuit 3 so as to absorb increasing leak currents.

With reference to FIG. 6, there is shown a first exemplary embodiment. In response to an ACC control signal ACC indicative of FCER mode (or ACC mode), a power supply switch section 8 performs a power supply switch. For example, although it is possible, during non-ACC mode, to provide sufficient supply of the positive bias voltage (such as 9 V) to the well by making use of a voltage step-up circuit disposed within the non-volatile memory device, it becomes impossible for the internally-disposed voltage step-up circuit to efficiently provide power supply during ACC mode as the range to be erased expands. To cope with this, an ACC power supply terminal 81 is provided as a dedicated power supply terminal, and with entry to ACC mode, positive bias voltage is supplied directly to the well from the ACC power supply terminal 81. In the first exemplary embodiment, the positive bias voltage supplied from the ACC power supply terminal 81 is provided to the negative voltage generator circuit 3 by the power supply switch section 8. For example, if 9 V is supplied as a positive bias power supply while the normal power supply voltage VCC is 1.8 V, this makes it possible to accomplish a substantial increase in voltage magnitude by a single pump operation when a charge pump circuit is employed as the negative voltage generator circuit 3. Thus, it becomes possible to generate desired negative voltages by less pumping. As a result, the negative voltage generator circuit 3 is simplified in circuit configuration and it becomes possible to accomplish a reduction in consumption current.

The ACC power supply terminal 81 serves also as a control terminal, an address terminal, or other like terminal that is not used during FCER mode, and the number of package terminals is cut down accordingly.

With reference to FIG. 7, there is shown a second exemplary embodiment. In the first exemplary embodiment, in the case where the positive bias voltage which is input from the ACC power supply terminal 81 is directly dealt with as a power supply voltage, it is required that the withstand pressure element of the negative voltage generator circuit 3 be designed according to the positive bias voltage, which means that the devices of the negative voltage generator circuit 3 have an excessive withstand pressure element for the power supply voltage VCC during normal operation, and there is a lot of waste for the circuit configuration. Therefore, in the second exemplary embodiment of FIG. 7, the positive bias voltage which is input from the ACC power supply terminal 81 is not used as is at the time of power supply switching during ACC mode. More specifically, a voltage step-down circuit is disposed internally, thereby making it possible to provide securement of the withstand pressure element of the negative voltage generator circuit 3 while, at the same time, realizing enough drive capacity, regardless of the ACC mode.

The positive bias voltage supplied from the ACC power supply terminal 81 is voltage-divided by resistor elements R2 and R3, wherein a voltage-divided bias voltage (for example, 5 V) which has a secured current supply capacity, is input to the power supply switch section 8 through a buffer circuit BUF. Hereby, direct application of a positive bias voltage of high level (such as 9 V) to the negative voltage generator circuit 3 is avoided. This not only eliminates the need to constitute the negative voltage generator circuit 3 from devices of high voltage endurance resistance to voltage but also enables the negative voltage generator circuit 3 to constantly have enough drive capacity, regardless of the ACC mode.

Figure 8:
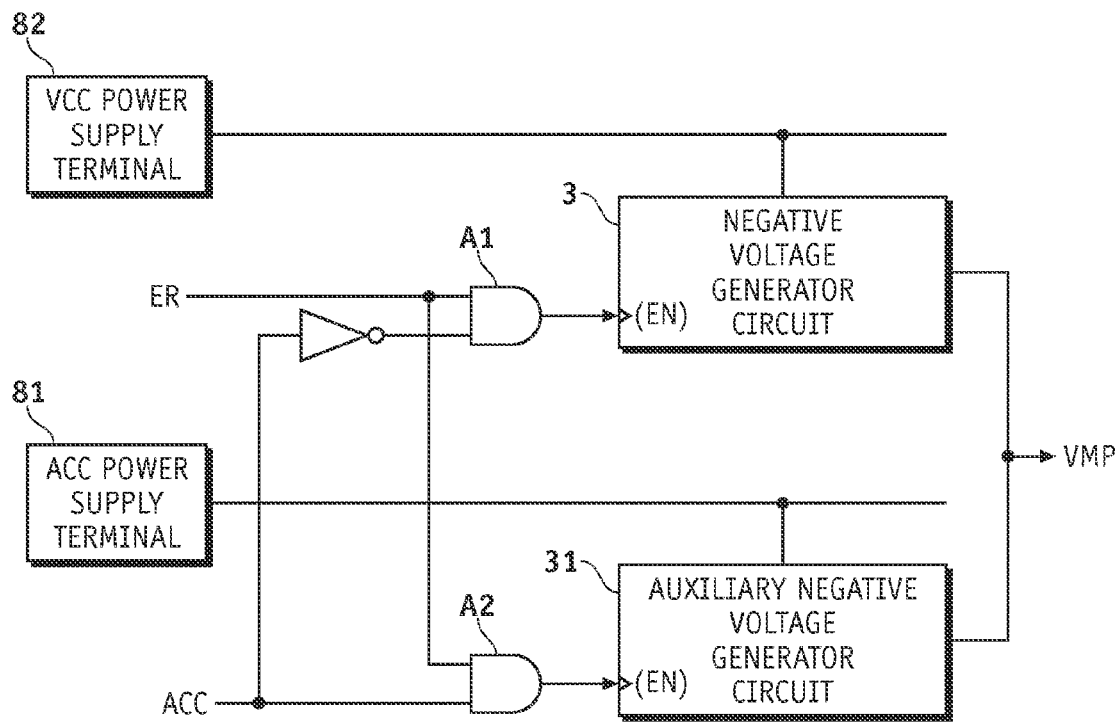
FIG. 8 is a circuit block diagram illustrating a first specific example of a third embodiment of the present invention.
Figure 9:
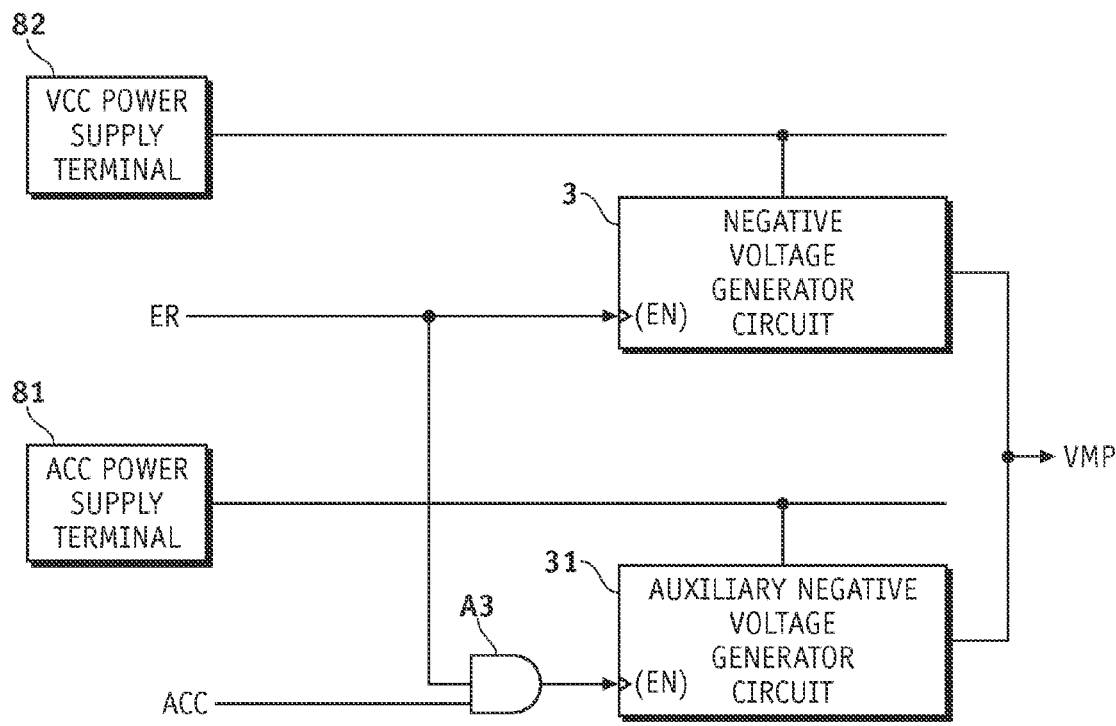
FIG. 9 is a circuit block diagram illustrating a second specific example of the third embodiment of the present invention.
Figure 10:
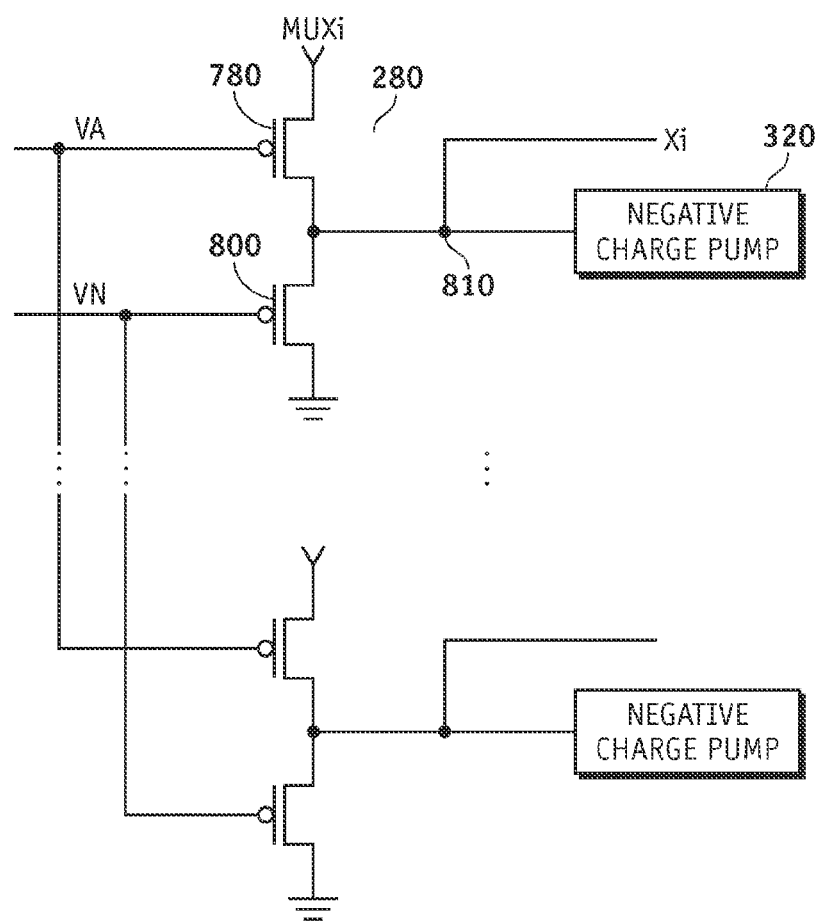
FIG. 10 is a circuit diagram illustrating prior art row-wise decoders.
Figure 11:
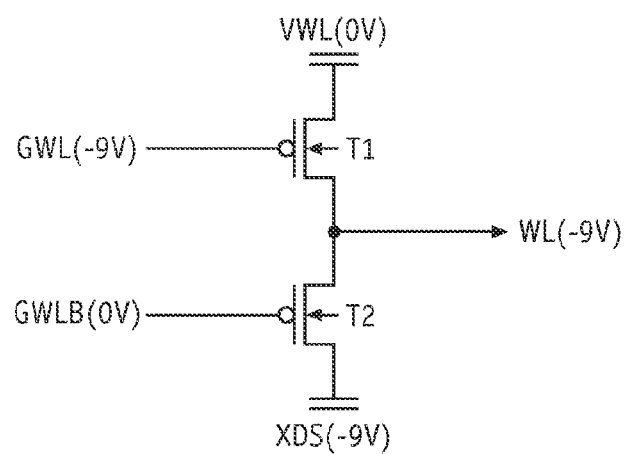
FIG. 11 is a circuit diagram illustrating row-wise decoders according to a different prior art technique.

With reference to FIGS. 8 and 9, there are shown circuit block diagrams in accordance with a third embodiment of the present invention. In the erase operation during non-ACC mode, in place of the negative voltage generator circuit 3 which is operated by being supplied with the power supply voltage VCC (such as 1.8 V) from a VCC power supply terminal 82 (FIG. 6), or in addition to the negative voltage generator circuit 3 (FIG. 7), an auxiliary negative voltage generator circuit 31 is supplied in FIG. 8, from the ACC power supply terminal 81, with a higher positive bias voltage (such as 9 V) relative to the power supply voltage VCC (such as 1.8 V) and is thereby activated. This auxiliary negative voltage generator circuit 31, activated by a positive bias voltage of higher level than that of the power supply voltage VCC, has a higher drive capacity than that of the negative voltage generator circuit 3 and is able to supply the second negative voltage supply line VMP with the second negative voltage VMP at a predetermined level, even during the ACC mode in which the amount of leak current increases because batch erasing is carried out in more sectors.

With reference to FIG. 8, an enable terminal (EN) of the negative voltage generator circuit 3 and an enable terminal (EN) of the auxiliary negative voltage generator circuit 31 are controlled, respectively, by an AND gate A1 and an AND gate A2. The AND gate A1 is supplied with an erase signal ER and an inversion signal of an ACC control signal ACC. In response to the erase signal ER of high level indicative of the erase operation and the ACC control signal ACC of low level indicative of the non ACC mode state, the negative voltage generator circuit 3 is activated. The AND gate A2 is supplied with the erase signal ER and the ACC control signal ACC. In response to the erase signal ER of high level indicative of the erase operation and the ACC control signal ACC of high level indicative of the ACC mode state, the auxiliary negative voltage generator circuit 31 is activated. Stated another way, the negative voltage generator circuit 3 and the auxiliary negative voltage generator circuit 31 are made active, respectively, in the ACC and non-ACC modes and provide the second negative voltage VMP to the second negative voltage supply line VMP.

With reference to FIG. 9, an enable terminal (EN) of the negative voltage generator circuit 3 and an enable terminal of the auxiliary negative voltage generator circuit 31 are controlled, respectively, by an erase signal ER and an AND gate A3. The AND gate A3 is supplied with an erase signal ER and an ACC control signal ACC. The negative voltage generator circuit 3 is constantly activated while, on the other hand, the auxiliary negative voltage generator circuit 31 is additionally activated in response to the ACC control signal ACC of high level indicative of the ACC mode state during the erase operation. In response to entry to the ACC mode, the auxiliary negative voltage generator circuit 31 is activated in addition to the negative voltage generator circuit 3, whereby the second negative voltage VMP is supplied to the second negative voltage supply line VMP.

Furthermore, in the case where the negative voltage generator circuit 3 is configured such that it is provided with a charge pump circuit, it is possible that during the ACC mode, the operation frequency, at which charge pump operations are carried out is higher during the ACC mode than during the non-ACC mode. The capacity to supply negative voltage can be improved by making the operation frequency of the charge pump circuit higher.

As the control circuit, the control section of FIG. 8 may be used as is. The circuit configuration of an oscillator for determination of the operation frequency in the charge pump circuit is known in the prior art. Any known techniques capable of increasing the frequency of operation may be employed. For example for the case of using a ring oscillator, it is possible to make the frequency of operation higher by increasing the capacity to supply electric power to each gate circuits which together constitute the ring oscillator. This power supply capacity is determined by supply current or supply voltage. The power supply capacity may be increased by either increasing supply current or increasing supply voltage. Additionally, in the case where there is provided a frequency divider circuit, it is possible to increase the frequency of operation to higher levels by the reduction of the frequency division ratio. Furthermore, when formed by an analog circuit for charging and discharging the capacitance components, higher frequencies are realized by the reduction of capacitance value or by the adjustment of the time constant of each gate circuit by making changes in analog amounts such as by the increase in a charge/discharge current value. It is possible to provide a frequency switch section capable of frequency switching in response to the output signal of the AND gate A2 by execution of these setting changes. In the ACC mode, thus, the operation frequency of the charge pump circuit is made higher.

As is obvious from the above description, in accordance with the first embodiment, in the lower decoder $20(i)(x)$ (i=1 to m; x=1 to n) the control terminal of the NMOS transistor TN3 which is an example of the first N-type transistor, i.e., the gate terminal, is supplied with the second negative voltage VMP whose level is lower than that of the first negative voltage VM which is supplied to the local word line WL(i)(x) from the NMOS transistor TN4. The NMOS transistor TN3 is reverse biased and enters the off state without fail. Even in the case where the threshold voltage is low and a leak current, such as a tailing current, flows when the gate-to-source voltage is 0 V, it is ensured that the reduction of leak current is accomplished because of the applied gate-to-source bias voltage. This ensures that the first negative voltage VM is supplied to the local word line WL(i)(x).

During the ACC mode or other like mode, either the number of sectors that are batch erased increases or the number of local word lines that are biased negatively increases. To cope with this, in the second or third embodiment, it is arranged such that the capacity to supply negative voltage is enhanced in response to a predetermined load condition causing the amount of leak current to increase and thereby causing the load of the negative voltage generator circuit to increase.

In summary, in the second embodiment, the power supply to the negative voltage generator circuit 3 is from the normal power supply voltage VCC (for example, 1.8 V) to the positive bias voltage (for example, 9 V) of high level which is supplied to the ACC power supply terminal 81 (FIG. 6), or is a voltage-divided bias voltage (for example, 5 V) as a result of voltage-division from the positive bias voltage by the internal circuit (FIG. 7).

Furthermore, in the third embodiment, in the ACC mode, either by switching to the auxiliary negative voltage generator circuit 31, serving as a substitute for the negative voltage generator circuit 3 which is activated when supplied with the normal power supply voltage VCC in the non-ACC mode, which, on the other hand, is supplied with a higher voltage from the ACC power supply terminal 81 (FIG. 8), or by making the auxiliary negative voltage generator circuit 31 active in addition to the negative voltage generator circuit 3 (FIG. 9), the capacity to supply the second negative voltage VMP is enhanced.

In addition, in the case where the negative voltage generator circuit is configured such that it is provided with a charge pump circuit, the capacity to supply negative voltage can be increased by making the operation frequency of the charge pump circuit higher.

This ensures that the first negative voltage VM is supplied to the local word line, thereby ensuring that circuit operations, such as an erase operation in which supply of the negative voltage is provided to local word lines, are carried out without fail.

Additionally, because of the reduction of leak current, it becomes possible to advantageously reduce the negative voltage supply capacity of the negative voltage generator circuit to a necessity minimum, and miniaturization of the circuit size can be achieved.

Furthermore, since the negative voltage supply capacity can be increased as the need arises, this makes it possible to accomplish the reduction of circuit consumption current by eliminating unnecessary voltage supply operations while at the same time accomplishing circuit-size miniaturization.

It should be understood that the present invention is not limited to the aforesaid embodiments, and various improvements and modifications may be made without departing from the sprit and the scope of the present invention.

For example, in the first embodiment, the description has been made in terms of the example configurations of the upper and lower decoders of FIGS. 1-3; however, the present invention is not limited to these example configurations. Needless to say, the same operation and effects may be obtained in other configurations.

In addition, in the present embodiment, the description has been made in terms of the example case where a layered word line structure of global and local word lines is provided as a word line configuration; however, the present invention is not limited to such example cases. The present invention is applicable, in the same manner as above, to where the word line structure is formed of a single layer as well as to where the word line structure is formed of multiple layers (three or more layers).

Furthermore, the level shift circuit 4 is described such that it is formed by a diode element (FIG. 5); however, the present invention is not limited thereto. Any other negative voltage step-down means capable of flowing an electric current with a substantially constant voltage transition is applicable.

Finally, it may be designed that the second negative voltage VMP is regulated by the regulator circuit 7 (FIG. 5).

What is claimed is:

1. A non-volatile memory device comprising:
   a first N-type transistor arranged between a first terminal and a word line, the first N-type transistor supplying the word line a positive voltage supplied to the first terminal in a manner of electrical conduction;
   a negative voltage generator section for generating a first negative voltage and for supplying a control terminal of the first N-type transistor a second negative voltage the level of which is lower than the first negative voltage; and
   a second N-type transistor arranged between a second terminal and the word line, the second N-type transistor discharging the positive voltage supplied to the word line by electrical conduction,
   wherein supply of the first negative voltage to the word line is conducted on condition that the second N-type transistor becomes conductive and the first negative voltage is supplied to the second terminal.

2. A non-volatile memory device according to claim 1 further comprising a third N-type transistor arranged between a third terminal and the control terminal of the first N-type transistor, the third N-type transistor discharging bias voltage supplied to the control terminal by electrical conduction,
   wherein supply of the second negative voltage to the control terminal is conducted on condition that the third N-type transistor becomes conductive and the second negative voltage is supplied to the third terminal.

* * * * *